(12) United States Patent
Cheng

(10) Patent No.: US 12,364,085 B2
(45) Date of Patent: Jul. 15, 2025

(54) SEMICONDUCTOR STRUCTURE AND SUBSTRATE THEREOF, AND MANUFACTURING METHODS FOR SEMICONDUCTOR STRUCTURES AND SUBSTRATES THEREOF

(71) Applicant: ENKRIS SEMICONDUCTOR, INC., Jiangsu (CN)

(72) Inventor: Kai Cheng, Jiangsu (CN)

(73) Assignee: ENKRIS SEMICONDUCTOR, INC., Jiangsu (CN)

( * ) Notice: Subject to any disclaimer, the term of this patent is extended or adjusted under 35 U.S.C. 154(b) by 809 days.

(21) Appl. No.: 17/617,737

(22) PCT Filed: Jan. 9, 2020

(86) PCT No.: PCT/CN2020/071185
§ 371 (c)(1),
(2) Date: Dec. 9, 2021

(87) PCT Pub. No.: WO2021/138873
PCT Pub. Date: Jul. 15, 2021

(65) Prior Publication Data
US 2022/0254975 A1    Aug. 11, 2022

(51) Int. Cl.
*H01L 33/00*     (2010.01)
*H10H 20/01*     (2025.01)
(Continued)

(52) U.S. Cl.
CPC .................. *H10H 20/8581* (2025.01); *H10H 20/01335* (2025.01); *H10H 20/812* (2025.01); *H10H 20/0365* (2025.01)

(58) Field of Classification Search
None
See application file for complete search history.

(56) References Cited

U.S. PATENT DOCUMENTS

| | | | |
|---|---|---|---|
| 9,728,673 B2 | 8/2017 | Nataf et al. | |
| 10,026,867 B2 | 7/2018 | Zheng et al. | |
| 2006/0026136 A1 | 2/2006 | Drucker et al. | |
| 2006/0261361 A1 | 11/2006 | Shakuda | |
| 2012/0299148 A1* | 11/2012 | Bowman ................ | H10D 8/422 257/E21.546 |

(Continued)

FOREIGN PATENT DOCUMENTS

| | | |
|---|---|---|
| CN | 1941437 A | 4/2007 |
| CN | 1957510 A | 5/2007 |

(Continued)

OTHER PUBLICATIONS

ISA State Intellectual Property Office of the People's Republic of China, International Search Report Issued in Application No. PCT/CN2020/071185, Oct. 12, 2020, WIPO, 4 pages.

(Continued)

*Primary Examiner* — Bradley Smith
(74) *Attorney, Agent, or Firm* — The Small Patent Law Group LLC; Christopher R. Carroll

(57) ABSTRACT

The present disclosure provides a semiconductor structure and substrate thereof, and manufacturing methods for semiconductor structure and substrate thereof. In the method for manufacturing the substrate, at least one of groove is provided in each subunit region on a surface of a premanufactured substrate, and the premanufactured substrate includes at least one unit region, each of the at least one unit region includes at least two subunit regions, the at least one of groove is filled with heat conduction materials to form a substrate; in one of the at least one unit region, the at least two subunit regions respectively have different heat conduction coefficients.

12 Claims, 10 Drawing Sheets

(51) Int. Cl.
   *H10H 20/812*   (2025.01)
   *H10H 20/858*   (2025.01)

(56) References Cited

U.S. PATENT DOCUMENTS

| | | | | |
|---|---|---|---|---|
| 2013/0087883 | A1* | 4/2013 | Mathew | ............ H01L 21/02271 |
| | | | | 257/E21.24 |
| 2016/0005918 | A1 | 1/2016 | Nataf et al. | |
| 2017/0373221 | A1 | 12/2017 | Zheng et al. | |
| 2020/0388631 | A1* | 12/2020 | Bin | ........................ H10B 43/10 |

FOREIGN PATENT DOCUMENTS

| | | |
|---|---|---|
| CN | 102376835 A | 3/2012 |
| CN | 105051917 A | 11/2015 |
| CN | 105226147 A | 1/2016 |
| CN | 106159052 A | 11/2016 |
| CN | 109830575 A | 5/2019 |

OTHER PUBLICATIONS

ISA State Intellectual Property Office of the People's Republic of China, Written Opinion of the International Searching Authority Issued in Application No. PCT/CN2020/071185, Oct. 12, 2020, 6 pages.(Submitted with Machine/Partial Translation).

State Intellectual Property Office of the People's Republic of China, Office Action and Search Report Issued in Application No. 2020800810036, Feb. 27, 2025, 18 pages. (Submitted with Machine Translation).

* cited by examiner

A prefabricated substrate is provided, wherein the prefabricated substrate includes at least one unit region, and each of the unit regions includes at least two unit sub-regions; grooves are provided in each of the unit sub-regions on a front face of the prefabricated substrate; and the grooves are filled with heat conduction materials, to form a substrate, wherein in one of the at least one unit region, heat conduction coefficients of various unit sub-regions are different ⎯ S1

A light-emitting layer is grown on a front face of the substrate, where in one of the at least one unit region, a light-emitting wavelength of the light-emitting layer of each unit sub-region differs ⎯ S2

FIG. 3

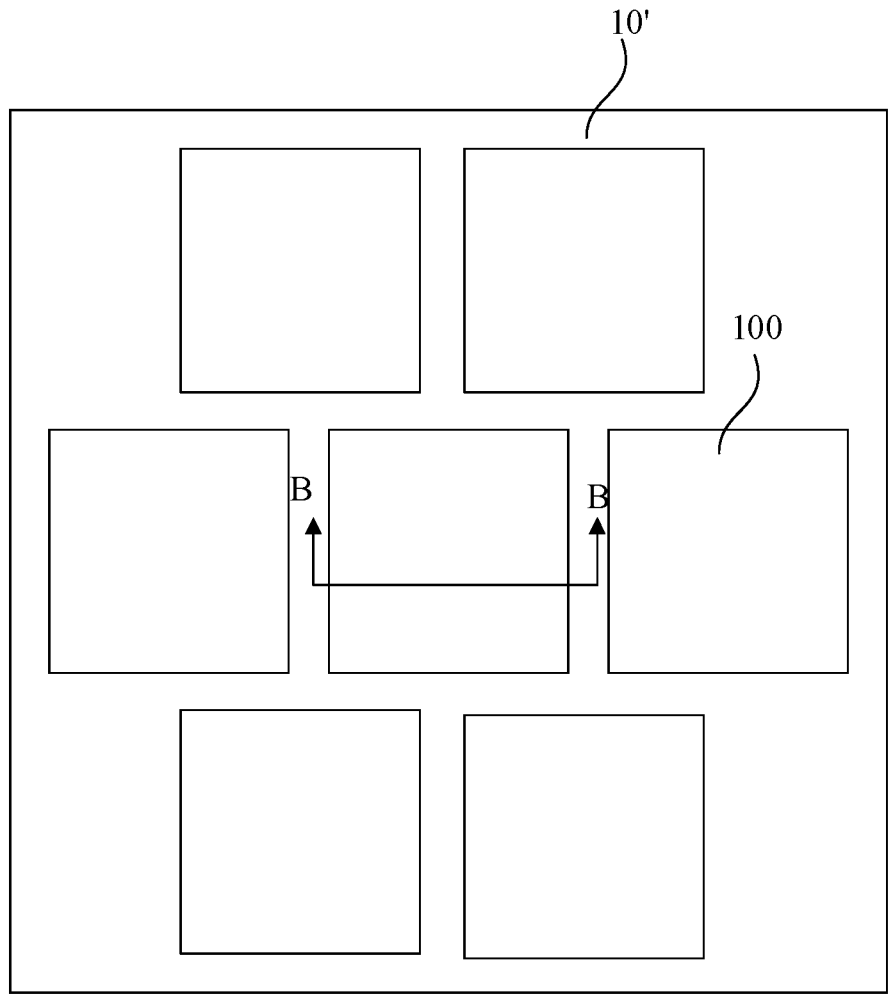

FIG. 4

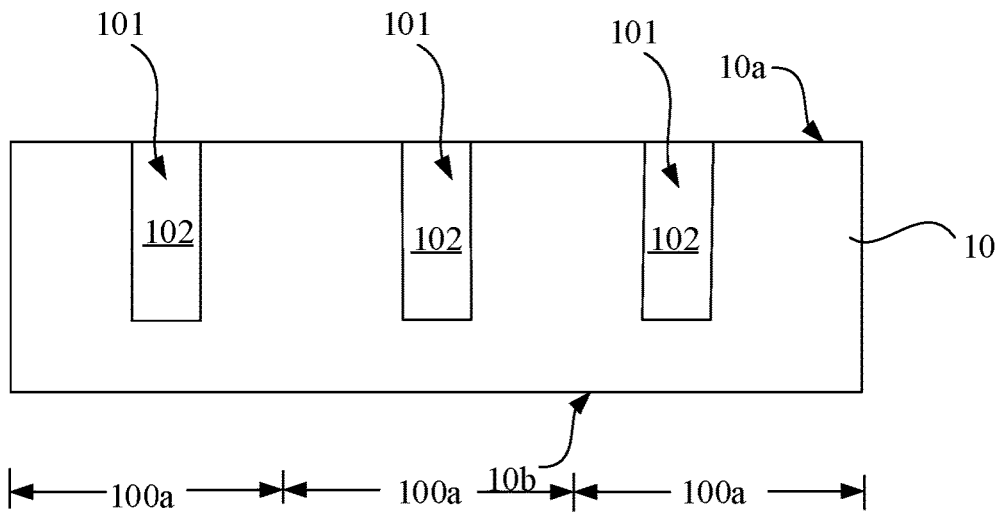

FIG. 7

A prefabricated substrate is provided, wherein the prefabricated substrate includes at least one unit region, and each of the unit regions includes at least two unit sub-regions; grooves are provided in each of the unit sub-regions on a front face of the prefabricated substrate; and the grooves are filled with heat conduction materials, to form a substrate, wherein in one of the at least one unit region, heat conduction coefficients of various unit sub-regions are different — S1

FIG. 8

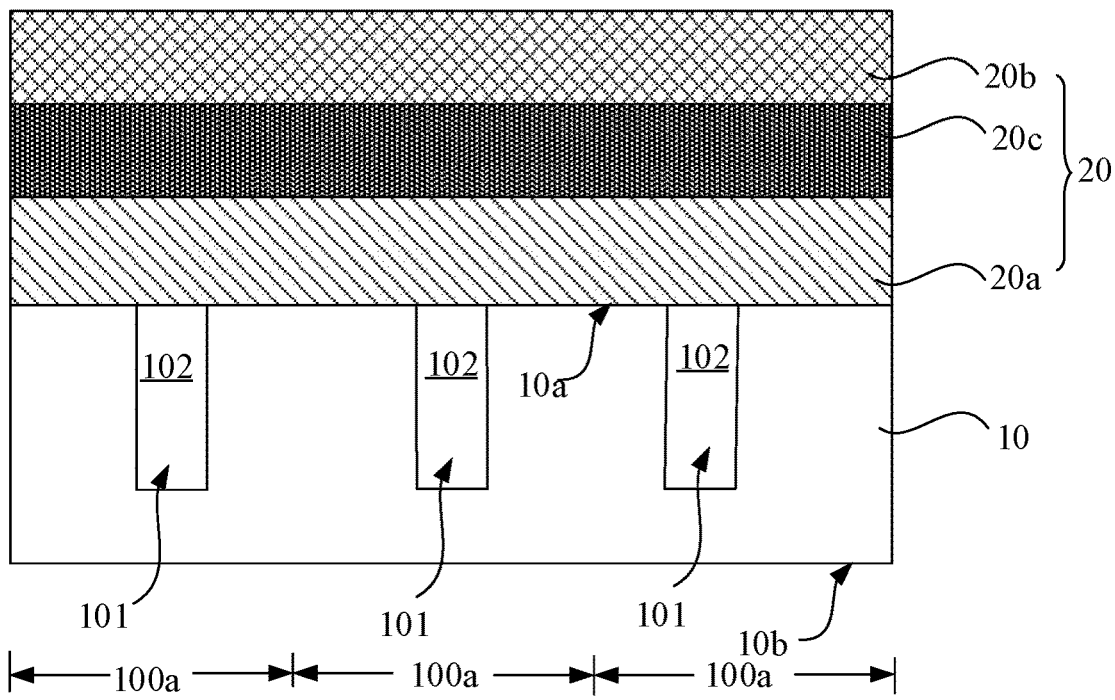

FIG. 9

A prefabricated substrate is provided, wherein the prefabricated substrate includes at least one unit region, and each of the unit regions includes at least two unit sub-regions; grooves are provided in each of the unit sub-regions on a back face of the prefabricated substrate; and the grooves are filled with heat conduction materials, to form a substrate, wherein in one of the at least one unit region, heat conduction coefficients of various unit sub-regions are different ~S1'

A light-emitting layer is grown on a front face of the substrate, where in a unit region, where in one of the at least one unit region, a light-emitting wavelength of the light-emitting layer of each unit sub-region differs ~S2

FIG. 10

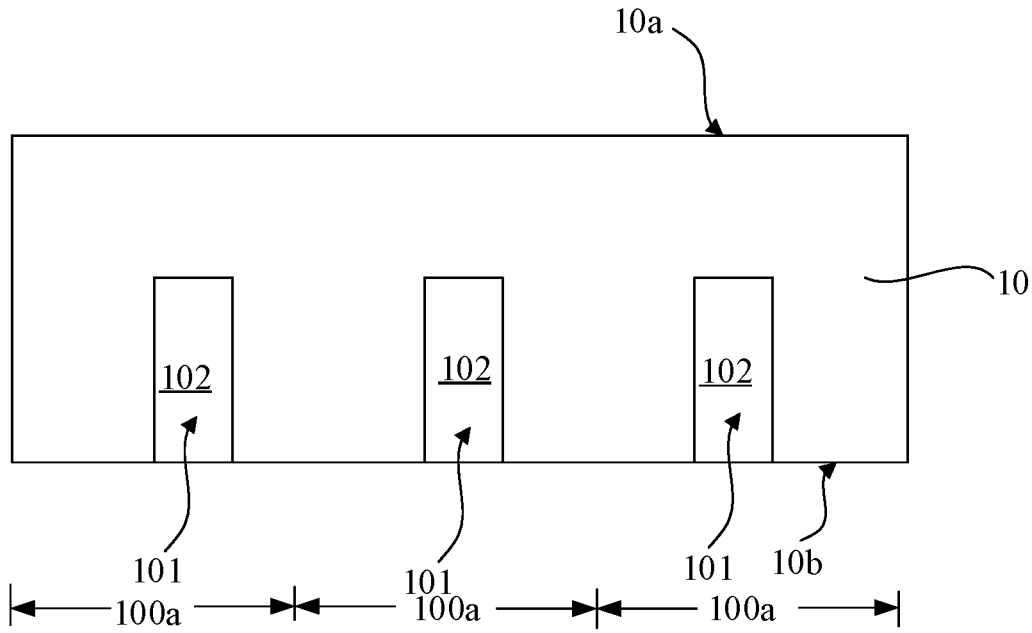

FIG. 11

A prefabricated substrate is provided, wherein the prefabricated substrate includes at least one unit region, and each of the unit regions includes at least two unit sub-regions; grooves are provided in each of the unit sub-regions on a back face of the prefabricated substrate; and the grooves are filled with heat conduction materials, to form a substrate, wherein in one of the at least one unit region, heat conduction coefficients of various unit sub-regions are different ~S1'

FIG. 12

SEMICONDUCTOR STRUCTURE AND SUBSTRATE THEREOF, AND MANUFACTURING METHODS FOR SEMICONDUCTOR STRUCTURES AND SUBSTRATES THEREOF

This application is a national stage entry of International Patent Application No. PCT/CN2020/071185 (filed 9 Jan. 2020), the entire disclosure of which is incorporated herein by reference.

TECHNICAL FIELD

The present disclosure relates to the field of semiconductor, and in particular, to a semiconductor structure and substrate thereof, and manufacturing methods for semiconductor structures and substrates thereof.

BACKGROUND

A light-emitting diode is called LED for short and radiates visible light by electron-hole recombination. Two major application fields of LED include: illumination and display. Especially in the field of display, the tendency of development in future includes: greater image quality and greater definition (more pixels and smaller pixels). The key technology to realize high-definition display is to realize ultra-small light-emitting pixels, and a smaller full-color LED light-emitting unit is needed.

In the related art, an existing full-color LED packaging unit has a size of 1 mm*1 mm. Front-mounted LED ships in red, green and blue are packaged on a PCB (Printed Circuit Board) through die bonding and wire bonding processes. Then, electrodes of the three types of chips are led out of the PCB from the back side through a conductive via process. Thus, the full-color LED packaging unit is formed. The full-color LED packaging unit is then soldered to a COB (chip on board) through a COB packaging process. A dot matrix LED display is formed through row/column wiring on the COB.

SUMMARY

The present disclosure provides a semiconductor structure and substrate thereof, and a method for manufacturing the same, which are used for a full-color LED, to reduce a size and costs of the full-color LED.

To this end, according to a first aspect of the present disclosure, provided is a substrate, the substrate includes: at least one unit region, wherein each of the at least one unit region comprises at least two subunit regions, at least one groove is provided in each of the at least two subunit regions, and a heat conduction material is filled in each of the at least one groove; and in one of the at least one unit region, the at least two subunit regions respectively have different heat conduction coefficients.

Optionally, in the one of the at least one unit region, the at least two subunit regions respectively have different preset porosities.

According to the present disclosure, the preset porosity of the subunit region refers to: a percentage of a total volume of grooves in a subunit region to a volume of a substrate block material of the subunit region.

Optionally, in the one of the at least one unit region, grooves in the at least two subunit regions respectively have different preset depths and/or different preset widths, and/or the at least two subunit regions respectively have different preset pore densities.

Optionally, in the one of the at least one unit region, grooves are provided on a front surface and/or a back surface of the substrate; or in the one of the at least one unit region, grooves in part of the at least two subunit regions are provided on a front surface or a back surface of the substrate; and grooves in another part of the at least two subunit regions are provided on the front surface and the back surface of the substrate.

Optionally, in the one of the at least one unit region, the at least two subunit regions respectively have different preset porosities; or the at least two subunit regions respectively have a same preset porosity; or preset porosities of part of the at least two subunit regions are different, and preset porosities of another part of the at least two subunit regions are the same.

Optionally, in the one of the at least one unit region, the grooves in the at least two subunit regions are respectively filled with different heat conduction materials; or the grooves in the at least two subunit regions are respectively filled with a same heat conduction material; or grooves in part of the at least two subunit regions are respectively filled with different heat conduction materials, and grooves in another part of the at least two subunit regions are respectively filled with a same heat conduction materials.

Optionally, in the one of the at least one unit region, the grooves in the at least two subunit regions are respectively filled with heat conduction materials with different porosities; or the grooves in the at least two subunit regions are respectively filled with a heat conduction material with a same porosity; or grooves in part of the at least two subunit regions are respectively filled with heat conduction materials with different porosities, and grooves in another part of the at least two subunit regions are respectively filled with a heat conduction material with a same porosity.

Optionally, the greater the preset porosity of the subunit region is, the greater the porosity of the heat conduction material in the at least one groove is; and the smaller the preset porosity of the subunit region is, the smaller the porosity of the heat conduction material in the at least one groove is.

Optionally, in the one of the at least one unit region, the grooves in the at least two subunit regions are respectively filled with heat conduction materials with different heat conduction coefficients; or the grooves in the at least two subunit regions are respectively filled with a heat conduction material with a same heat conduction coefficient; or, grooves in part of the at least two subunit regions are respectively filled with heat conduction materials with different heat conduction coefficients, and grooves in another part of the at least two subunit regions are respectively filled with a heat conduction material with a same heat conduction coefficient.

Optionally, the greater the preset porosity of the subunit region is, the smaller the heat conduction coefficient of the heat conduction material in the at least one groove is; and the smaller the preset porosity of the subunit region is, the greater the heat conduction coefficient of the heat conduction material in the at least one groove is.

Optionally, wherein the at least one groove is fully filled with the heat conduction material, or an air gap is provided in the at least one groove.

Optionally, a material of the substrate is at least one of sapphire, silicon, silicon carbide or a GaN-based material.

According to a second aspect of the present disclosure, provided is a semiconductor structure. The semiconductor structure includes: the above-mentioned substrate; and a light-emitting layer disposed on a front surface of the substrate, wherein in the one of the at least one unit region, a light-emitting wavelength of the light-emitting layer for each of the at least two subunit regions differs.

Optionally, the light-emitting layer includes an N-type semiconductor layer, a P-type semiconductor layer, and a multi-quantum well material layer disposed between the N-type semiconductor layer and the P-type semiconductor layer.

Optionally, the light-emitting layer comprises multiple N-type semiconductor layers and multiple P-type semiconductor layers, wherein the multiple N-type semiconductor layers and the multiple P-type semiconductor layers are disposed alternately, and multi-quantum well material layers are respectively disposed between each of the N-type semiconductor layers and the P-type semiconductor layer adjacent to the N-type semiconductor layer.

Optionally, the semiconductor structure is used for display; and the light-emitting layer of each of the at least one unit region form a light-emitting unit.

According to a third aspect of the present disclosure, provided is a method for manufacturing a substrate. The method includes: providing a premanufactured substrate, wherein the premanufactured substrate comprises at least one unit region, and each of the at least one unit region comprises at least two subunit regions; providing at least one groove in each of the at least two subunit regions on a surface of the premanufactured substrate; and filling each of the at least one groove with a heat conduction material to form a substrate, wherein in the one of the at least one unit region, the at least two subunit regions respectively have different heat conduction coefficients.

Optionally, before each of the at least one the groove is filled with the heat conduction material, in the one of the at least one unit region, the at least two subunit regions respectively have different preset porosities.

Optionally, in the one of the at least one unit region, grooves in the at least two subunit regions respectively has different preset depths and/or different preset widths, and/or the at least two subunit regions respectively have different preset pore densities.

Optionally, in each of the at least one unit region, grooves are provided on a front surface or a back surface of the substrate; or in each of the at least one unit region, grooves in part of the at least two subunit regions are provided on a front surface or a back surface of the substrate; and grooves in another part of the at least two subunit regions are provided on the front surface and the back surface of the substrate.

Optionally, in the one of the at least one unit region, the at least two subunit regions respectively have different preset porosities; or the at least two subunit regions respectively have a same preset porosity; or preset porosities of part of the at least two subunit regions are different, and preset porosities of another part of the at least two subunit regions are the same.

Optionally, in the one of the at least one unit region, the grooves in the at least two subunit regions are respectively filled with different heat conduction materials; or the grooves in the at least two subunit regions are respectively filled with a same heat conduction material; or grooves in part of the at least two subunit regions are respectively filled with different heat conduction materials, and grooves in another part of the at least two subunit regions are respectively filled with a same heat conduction materials.

Optionally, in the one of the at least one unit region, the grooves in the at least two subunit regions are respectively filled with heat conduction materials with different porosities; or the grooves in the at least two subunit regions are respectively filled with a heat conduction material with a same porosity; or grooves in part of the at least two subunit regions are respectively filled with heat conduction materials with different porosities, and grooves in another part of the at least two subunit regions are respectively filled with a heat conduction material with a same porosity.

Optionally, the greater the preset porosity of the subunit region is, the greater the porosity of the heat conduction material in the at least one groove is; and the smaller the preset porosity of the subunit region is, the smaller the porosity of the heat conduction material in the at least one groove is.

Optionally, in the one of the at least one unit region, the grooves in the at least two subunit regions are respectively filled with heat conduction materials with different heat conduction coefficients; or the grooves in the at least two subunit regions is respectively filled with a heat conduction material with a same heat conduction coefficient; or, grooves in part of the at least two subunit regions are respectively filled with heat conduction materials with different heat conduction coefficients, and grooves in another part of the at least two subunit regions are respectively filled with a heat conduction material with a same heat conduction coefficient.

Optionally, the greater the preset porosity of the subunit region is, the smaller the heat conduction coefficient of the heat conduction material in the at least one groove is; and the smaller the preset porosity of the subunit region is, the greater the heat conduction coefficient of the heat conduction material in the at least one groove is.

Optionally, in the step of filling each of the at least one groove with the heat conduction materials, the at least one groove is fully filled with the heat conduction material, or an air gap is provided in the at least one groove.

According to a fourth aspect of the present disclosure, provided is a method for manufacturing a semiconductor structure. The method includes: manufacturing a substrate by the above-mentioned method; and growing a light-emitting layer on a front surface of the substrate, wherein in the one of the at least one unit region, a light-emitting wavelength of the light-emitting layer for each of the at least two subunit regions differs.

Optionally, the light-emitting layer includes: an N-type semiconductor layer, a P-type semiconductor layer, and a multi-quantum well material layer disposed between the N-type semiconductor layer and the P-type semiconductor layer.

Optionally, the multiple N-type semiconductor layers and the multiple P-type semiconductor layers are disposed alternately, and multi-quantum well material layers are respectively disposed between each of the N-type semiconductor layers and the P-type semiconductor layer adjacent to the N-type semiconductor layer.

Optionally, a forbidden bandwidth of the multi-quantum well material layer increases along with the rise of a growth temperature; the greater the preset porosity of the subunit region is, the greater the porosity of heat conduction material in the at least one groove is, and the longer the light-emitting wavelength of the corresponding light-emitting layer is; and the smaller the preset porosity of the subunit region is, the smaller the porosity of the heat conduction material in the at least one grooves is, and the shorter the light-emitting wavelength of the corresponding light-emitting layer is.

Optionally, a forbidden bandwidth of the multi-quantum well material layer increases along with the rise of a growth temperature; the greater the preset porosity of the subunit region is, the smaller a heat conduction coefficient of heat conduction material in the at least one groove is, and the longer the light-emitting wavelength of the corresponding light-emitting layer is; and the smaller the preset porosity of the subunit region is, the greater the heat conduction coefficient of the heat conduction material in the at least one groove is, and the shorter the light-emitting wavelength of the corresponding light-emitting layer is.

Optionally, a method for growing the light-emitting layer includes at least one of atomic layer deposition, chemical vapor deposition, molecular beam epitaxy, plasma enhanced chemical vapor deposition, low pressure chemical vapor deposition, or metal-organic chemical vapor deposition.

Optionally, the semiconductor structure is used for display; and the light-emitting layer respectively grown on each of the at least one unit region forms a light-emitting unit.

Compared with the related art, the present disclosure has the beneficial effects as below.

1) In the method for manufacturing the semiconductor structure of the present disclosure, grooves are provided in each of the subunit regions on a surface of a premanufactured substrate. The premanufactured substrate includes at least one unit region. Each of the unit regions includes at least two subunit regions. The grooves are filled with heat conduction materials to form a substrate. In one of the at least one unit region, heat conduction coefficients of various subunit regions are different. When a susceptor transfers heat to the substrate, heat conduction efficiencies of various subunit regions are different. Under the influences of a growth temperature on a luminous property of a multi-quantum well material layer, when a light-emitting layer is grown on a front surface of the substrate, the light-emitting layer has different light-emitting wavelengths in different subunit regions. The foregoing process is simple. The semiconductor structure for a full-color LED can be manufactured on the substrate, such that a size and costs of the full-color LED are reduced.

2) In optional solutions, the heat conduction materials are porous materials, and porosities of the heat conduction materials in the grooves of various subunit regions are different. The heat conduction efficiencies of the heat conduction materials are controlled through the porosities.

3) In optional solutions, preset porosities of various subunit regions are the same. For the multi-quantum well material layer of which a forbidden bandwidth increases along with the rise of the growth temperature, the greater the porosity of the heat conduction material is, the longer the light-emitting wavelength of the corresponding light-emitting layer is. The smaller the porosity of the heat conduction material is, the shorter the light-emitting wavelength of the corresponding light-emitting layer is. The greater the porosity of the heat conduction material is, the lower the heat conduction efficiency is, the lower the temperature at the heat conduction material is, the forbidden bandwidth of the grown multi-quantum well material layer becomes narrower, the frequency at which photons are generated by electron transition becomes smaller, and the wavelength becomes longer. Otherwise, the wavelength becomes shorter.

4) In optional solutions, preset porosities of various subunit regions are different. Through the combination of the preset porosities of various subunit regions and the porosities of the heat conduction materials, temperatures at different positions of the substrate are controlled. For the multi-quantum well material layer of which a forbidden bandwidth increases along with the rise of the growth temperature, the greater the preset porosity of one subunit region is, the greater the porosity of the heat conduction material in the groove of the subunit region is, and the longer the light-emitting wavelength of the corresponding light-emitting layer is. The smaller the preset porosity of one subunit region is, the smaller the porosity of the heat conduction material in the at least one groove in the subunit region is, and the shorter the light-emitting wavelength of the corresponding light-emitting layer is. The greater the preset porosity of the subunit region is, the greater the porosity of the heat conduction material in the groove is, the lower the heat conduction efficiency of the subunit region is, the lower the temperature of the front surface of the subunit region is, the forbidden bandwidth of the grown multi-quantum well material layer becomes narrower, the frequency at which photons are generated by electron transition becomes smaller, and the wavelength becomes longer. Otherwise, the wavelength becomes shorter.

5) In optional solutions, heat conduction coefficients of the heat conduction materials in the grooves of various subunit regions are different. The heat conduction efficiency of the heat conduction material is controlled through the heat conduction coefficient.

6) In optional solutions, preset porosities of various subunit regions are the same. For the multi-quantum well material layer of which a forbidden bandwidth increases along with the rise of the growth temperature, the greater the heat conduction coefficient of the heat conduction material is, the shorter the light-emitting wavelength of the corresponding light-emitting layer is. The smaller the heat conduction coefficient of the heat conduction material is, the longer the light-emitting wavelength of the corresponding light-emitting layer is. The greater the heat conduction coefficient of the heat conduction material is, the higher the heat conduction efficiency is, the higher the temperature at the heat conduction material is, the forbidden bandwidth of the grown multi-quantum well material layer becomes wider, the frequency at which photons are generated by electron transition becomes greater, and the wavelength becomes shorter. Otherwise, the wavelength becomes longer.

7) In optional solutions, preset porosities of various subunit regions are different. Through the combination of the preset porosities of various subunit regions and the heat conduction coefficients of the heat conduction materials, temperatures at different positions of the substrate are controlled. For the multi-quantum well material layer of which a forbidden bandwidth increases along with the rise of the growth temperature, the smaller the preset porosity of one subunit region is, the greater the heat conduction coefficient of the heat conduction material in the groove of the subunit region is, and the shorter the light-emitting wavelength of the corresponding light-emitting layer is. The greater the preset porosity of one subunit region is, the smaller the heat conduction coefficient of the heat conduction material in the at least one groove of the subunit region is, and the longer the light-emitting wavelength of the corresponding light-emitting layer is. The smaller the preset porosity of the subunit region is, the greater the heat conduction coefficient of the heat conduction material in the at least one groove of the subunit region is, the higher the heat conduction efficiency of the subunit region is, the higher the temperature of the front surface of the subunit region is, the forbidden bandwidth of the grown multi-quantum well material layer becomes wider, the frequency at which photons are generated by electron transition becomes greater, and the wavelength becomes shorter. Otherwise, the wavelength becomes longer.

8) In optional solutions, a) the grooves are filled with the heat conduction material. Alternatively, b) air gaps are provided in the grooves. In the solution b), through the combination of sizes of the air gaps and quantities of the heat conduction materials, heat conduction efficiency is adjusted.

9) In optional solutions, a) the light-emitting layer includes an N-type semiconductor layer, a P-type semiconductor layer, and a multi-quantum well material layer disposed between the N-type semiconductor layer and the P-type semiconductor layers. Alternatively, b) the light-emitting layer includes multiple N-type semiconductor layers and multiple P-type semiconductor layers, where the multiple N-type semiconductor layers and the multiple P-type semiconductor layers are disposed alternately, and multi-quantum well material layers are respectively disposed between each of the N-type semiconductor layers and the P-type semiconductor layers adjacent to the N-type semiconductor layer. Comparing with the solution a), the solution b) can improve light-emitting efficiencies of the light-emitting layer.

10) In optional solutions, the semiconductor structure is used for display. The unit regions are distributed in arrays, and the light-emitting layer respectively grown on each of the unit regions forms a light-emitting unit. Through the foregoing method, a plurality of pixel units distributed in arrays can be manufactured simultaneously. In another optional solutions, a plurality of semiconductor structures for illumination can further be manufactured simultaneously.

BRIEF DESCRIPTION OF THE DRAWINGS

FIG. 3 is a flowchart of a method for manufacturing a semiconductor structure in FIG. 1 and FIG. 2;

FIG. 4 is a top view of a premanufactured substrate in the flowchart in FIG. 3;

FIG. 7 is a sectional view along the line CC in FIG. 6;

FIG. 8 is a flowchart of a method for manufacturing a substrate in FIG. 6 and FIG. 7;

FIG. 9 is a cross-sectional schematic structural diagram of a semiconductor structure according to a third embodiment of the present disclosure;

FIG. 10 is a flowchart of a method for manufacturing a semiconductor structure in FIG. 9;

FIG. 11 is a cross-sectional schematic structural diagram of a substrate according to a fourth the fourth embodiment of the present disclosure;

FIG. 12 is a flowchart of a method for manufacturing a substrate in FIG. 11;

Figure 1:
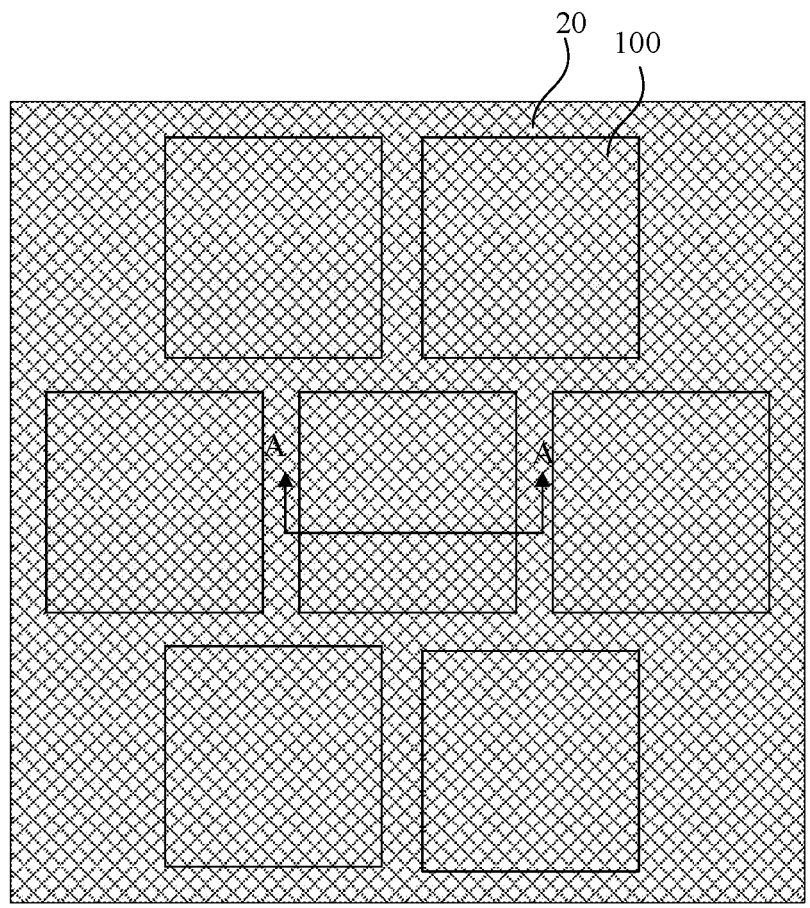
FIG. 1 is a top view of a semiconductor structure according to a first embodiment of the present disclosure.

For the convenience of understanding of the present invention, all reference numerals appearing in the present disclosure are listed below:
premanufactured substrate 10'
unit region 100
subunit region 100a
front surface 10a of a premanufactured substrate or a substrate
groove 101
heat conduction material 102
light-emitting layer 20
N-type semiconductor layer 20a
P-type semiconductor layer 20b
multi-quantum well material layer 20c
air gap 101a
back surface 10b of a premanufactured substrate or a substrate
substrate 10.

DETAILED DESCRIPTION OF THE EMBODIMENTS

To make the forgoing objectives, features and advantages of the present disclosure clearer and more comprehensible, the following describes the specific embodiments of the present disclosure in detail with reference to the accompanying drawings.

Figure 2:
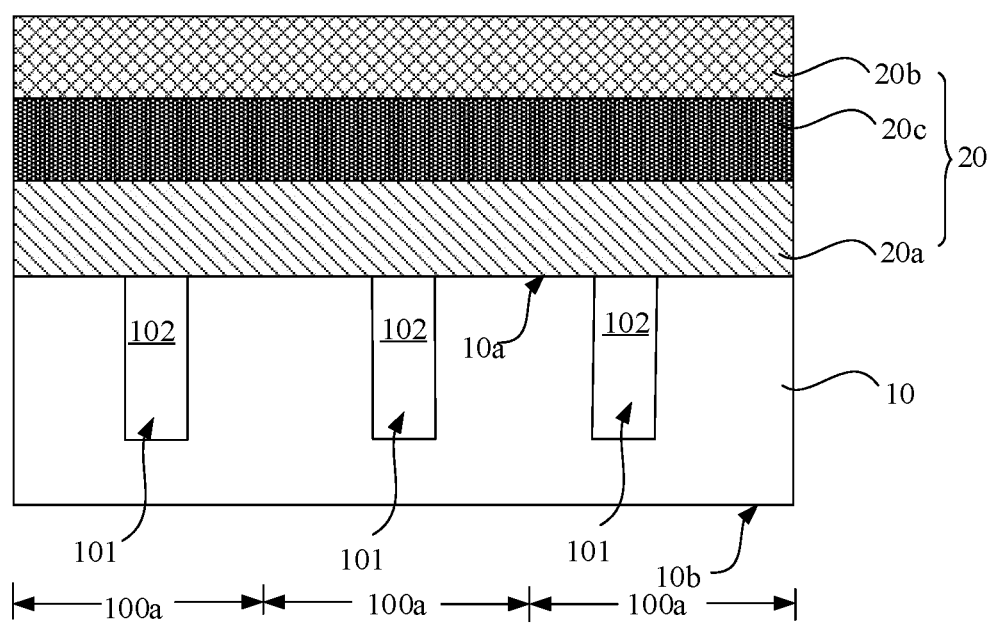
FIG. 2 is a sectional view along the line AA in FIG. 1.
Figure 5:
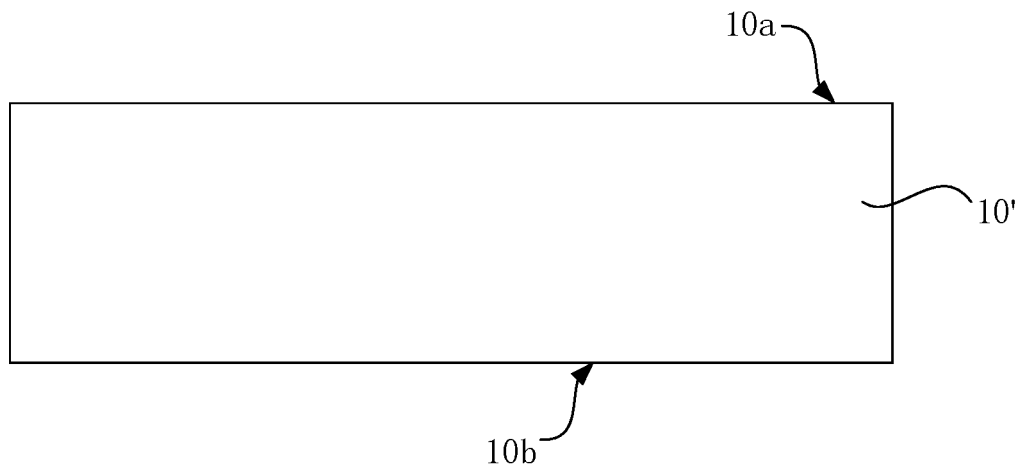
FIG. 5 is a sectional view along the line BB in FIG. 4.

FIG. 1 is a top view of a semiconductor structure according to a first embodiment of the present disclosure. FIG. 2 is a sectional view along the line AA in FIG. 1. FIG. 3 is a flowchart of a method for manufacturing a semiconductor structure in FIG. 1 and FIG. 2. FIG. 4 is a top view of a premanufactured substrate in the flowchart in FIG. 3. FIG. 5 is a sectional view along the line BB in FIG. 4.

Firstly, with reference to step S1 in FIG. 3, FIG. 1, FIG. 2, FIG. 4 and FIG. 5, a premanufactured substrate 10' is provided, where the premanufactured substrate 10' includes at least one unit region 100, and each of the unit regions 100 includes at least two subunit regions 100a; grooves 101 are provided in each of the subunit regions 100a on a front surface 10a of the premanufactured substrate 10; and the grooves 101 are filled with heat conduction materials 102, to form a substrate 10, where in one of the at least one unit region 100, heat conduction coefficients of various subunit regions 100a are different.

The premanufactured substrate 10' may be sapphire, silicon carbide, silicon or GaN-based material.

In the embodiment, the semiconductor structure is used for display. The at least one unit region 100 are distributed in arrays, each unit region 100 corresponds to a pixel unit region, each of the subunit regions 100a corresponds to a sub-pixel region. In step S1, at least two grooves 101 are provided in each pixel unit region.

In another embodiments, the semiconductor structure may further be used for illumination. The at least one unit region 100 are distributed in arrays, each unit region 100 corresponds an illumination unit region, each of the subunit regions 100a corresponds to a primary-color light-emitting structural region. In step S1, at least two grooves 101 are provided in each illumination unit region.

In the embodiment as shown in FIG. 2, preferably, there are three grooves 101 corresponding to LED light-emitting structures forming three primary colors red, green and blue.

The grooves 101 may be formed with methods of dry-etching, laser grooving, mechanical grooving, or the like.

With reference to FIG. 2, in one of the at least one unit region 100, preset depths, preset widths of the grooves 101 and preset pore densities of various subunit regions 100a are the same. Therefore, preset porosities of various subunit regions 100a are the same.

The preset porosity of each of the subunit regions 100a refers to: a percentage of a total volume of grooves 101 in a subunit region 100a to a volume of a substrate block material of the subunit region 100a.

The preset pore density of each of the subunit regions 100a refers to: the number of grooves 101 in a unit volume of the subunit region 100a.

The heat conduction materials 102 may be porous materials, for example, a low-K dielectric layer ($SiO_2$), magnesium oxide (MgO), aluminum oxide ($Al_2O_3$), or the like.

In one of the at least one unit region 100, porosities of the heat conduction materials 102 in the grooves 101 of various subunit regions 100a are different.

With reference to FIG. 2, in the embodiment, the grooves 101 are fully filled with the heat conduction materials 102.

Then, with reference to step S2 in FIG. 3, FIG. 4 and FIG. 5, a light-emitting layer 20 is grown on a front surface 10a of the substrate, where in one of the at least one unit region 100, a light-emitting wavelength of the light-emitting layer 20 of each subunit region 100a differs.

When the light-emitting layer 20 is growing, a back surface 10b of the substrate is placed on a susceptor in a reaction chamber. A heating device is disposed in the susceptor. The susceptor transfers heat to the substrate 10, to heat the substrate 10 to a growth temperature.

The light-emitting layer 20 may include an N-type semiconductor layer 20a, a P-type semiconductor layer 20b, and a multi-quantum well material layer 20c disposed between the N-type semiconductor layer 20a and the P-type semiconductor layer 20b.

A material of the N-type semiconductor layer 20a, a material of the multi-quantum well material layer 20c and a material of the P-type semiconductor layer 20b may include at least one of GaN, AlN, InN, InAlGaN, InAlN, GaAs or AlGaAs. A forming process may include: atomic layer deposition (ALD), chemical vapor deposition (CVD), molecular beam epitaxy (MBE), plasma enhanced chemical vapor deposition (PECVD), low pressure chemical vapor deposition (LPCVD), metal-organic chemical vapor deposition (MOCVD), or combinations thereof.

Before the N-type semiconductor layer 20a is formed on the substrate 10, a nucleation layer and a buffer layer (not shown in the figures) may further be formed in sequence. A material of the nucleation layer may include, for example, AlN, AlGaN, or the like. A material of the buffer layer may include at least one of AN, GaN, AlGaN or AlInGaN. A method for forming the buffer layer may be the same as a method for forming the N-type semiconductor layer 20a. The nucleation layer may relieve problems of lattice mismatch and heat mismatch between epitaxially grown semiconductor layers, for example, between the N-type semiconductor layer 20a and the multi-quantum well material layer 20c and between the multi-quantum well material layer 20c and the P-type semiconductor layer 20b. The buffer layer may reduce dislocation density and defect density of the epitaxially grown semiconductor layers and improve crystal quality.

In step S2, preset porosities of various subunit regions 100a are the same. The greater the porosity of the heat conduction material 102 in the groove 101 is, the longer the light-emitting wavelength of the light-emitting layer 20 corresponding to the groove 101 may be; and the smaller the porosity of the heat conduction material 102 in the groove 101 is, the shorter the light-emitting wavelength of the light-emitting layer 20 corresponding to the groove 101 may be. The greater the porosities of the heat conduction materials 102 are, the lower the heat conduction efficiencies are, and the lower the temperatures of front surfaces of the subunit regions 100a are; and the smaller the porosities of the heat conduction materials 102 are, the higher the heat conduction efficiencies are, and the higher the temperatures of front surfaces of the subunit regions 100a are. The light-emitting wavelength of the grown multi-quantum well material layer 20c may vary based on temperature. Specifically, firstly, in a direct bandgap material, the wavelength is in inverse proportion to the width of the bandgap (i.e., forbidden bandwidth). Secondly, the forbidden bandwidth of some semiconductor material has a positive temperature coefficient, that is, when the growth temperature rises, the forbidden bandwidth increases, and therefore the wavelength is in inverse proportion to the temperature; and some semiconductor material has a negative temperature coefficient, that is, when the growth temperature rises, the forbidden bandwidth decreases, and therefore the wavelength is in direct proportion to the temperature. For example, common InGaN is a semiconductor material with a positive temperature coefficient.

In some embodiments, the P-type semiconductor layer 20b may be close to the substrate 10, and the N-type semiconductor layer 20a may be away from the substrate 10.

In some embodiments, in one of the at least one unit region 100, heat conduction coefficients of the heat conduction materials 102 in the grooves 101 of various subunit regions 100a may be different. Components of the heat conduction materials 102 may be different, for example, may be different metals or dielectric materials, such as copper, aluminum, silicon dioxide, silicon nitride, or the like.

Specifically, the greater the heat conduction coefficient of the heat conduction material 102 is, the shorter the light-emitting wavelength of the light-emitting layer 20 corresponding to the heat conduction material 102 may be. The smaller the heat conduction coefficient of the heat conduction material 102 is, the longer the light-emitting wavelength of the light-emitting layer 20 corresponding to the heat conduction material 102 may be. Since the greater the heat conduction coefficients of the heat conduction materials 102 are, the higher the heat conduction efficiencies are, and the higher the temperatures at the heat conduction materials 102 are. For the multi-quantum well material layer 20c of which the forbidden bandwidth increases along with the rise of the growth temperature, the forbidden bandwidth of the grown multi-quantum well material layer 20c becomes wider, the frequency at which photons are generated by electron transition becomes greater, and the wavelengths become shorter. Conversely, the smaller the heat conduction coefficients of the heat conduction materials 102 are, the lower the heat conduction efficiencies are, the lower the temperatures at the heat conduction materials 102 are, the forbidden bandwidth of the grown multi-quantum well material layer 20c becomes narrower, the frequency at which photons are generated by electron transition becomes smaller, and the wavelengths become longer.

In some embodiments, an electric connection structure that is electrically connected to the N-type semiconductor layer 20a and the P-type semiconductor layer 20b respectively may further be manufactured on the semiconductor structure, to form a full-color LED.

For the semiconductor structure for display, the light-emitting layer 20 grown on each pixel unit region 100 forms a light-emitting unit. For the semiconductor structure for illumination, cutting may further be performed along cutting lines between adjacent illumination unit regions 100, to form a plurality of illumination units.

In a method for manufacturing a semiconductor structure in the embodiment, in one of the at least one unit region 100, grooves 101 that have the same preset depth, the same preset width and the same preset pore density are provided in each of the subunit regions 100a on the front surface 10a of the premanufactured substrate 10'. The different grooves 101 are filled with different heat conduction materials 102, to form a substrate 10. When a susceptor transfers heat to the substrate 10, heat conduction efficiencies of various subunit regions 100a are different. Under the influences of a growth temperature on a luminous property of the multi-quantum well material layer 20c, when the light-emitting layer 20 is grown on the front surface 10a of the substrate, a light-emitting wavelength of the light-emitting layer 20 of different subunit regions 100a is different. The foregoing process is simple. The semiconductor structure for a full-color LED can be manufactured on the substrate 10. This reduces a size of the full-color LED and reduces costs.

Figure 6:
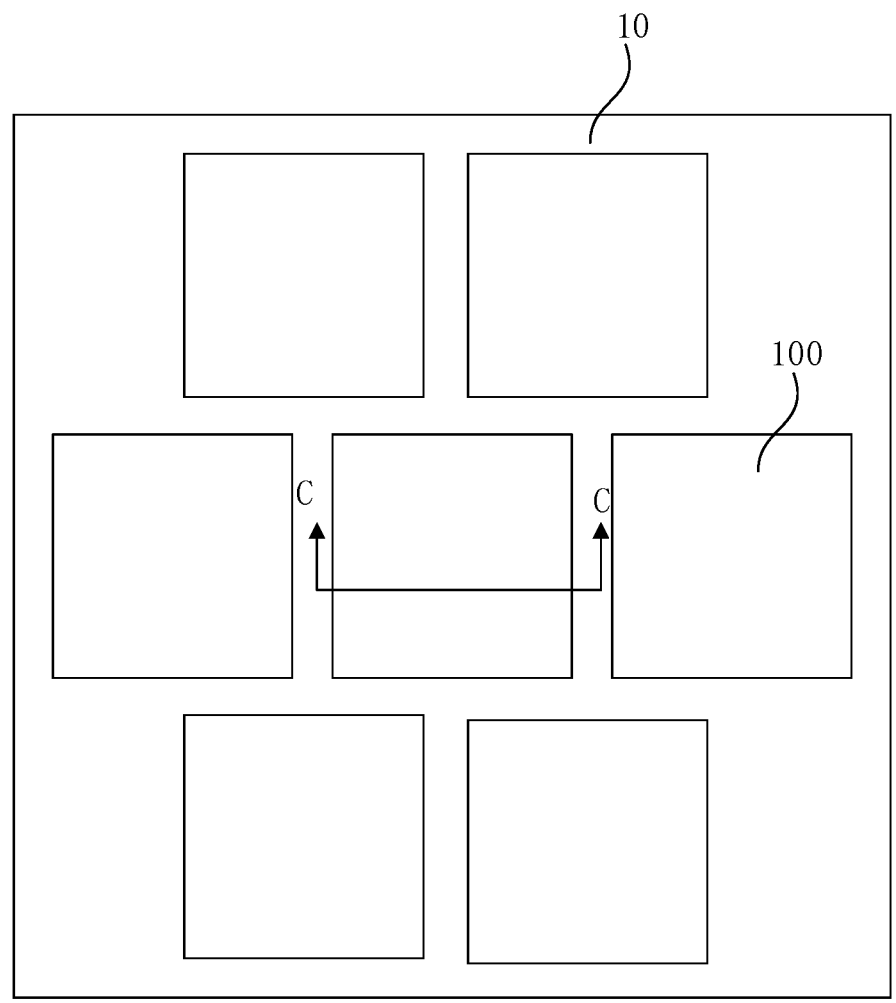
FIG. 6 is a top view of a substrate according to a second embodiment of the present disclosure.

FIG. 6 is a top view of a substrate according to a second embodiment of the present disclosure. FIG. 7 is a sectional view along the line CC in FIG. 6. FIG. 8 is a flowchart of a method for manufacturing a substrate in FIG. 6 and FIG. 7.

With reference to FIG. 6 to FIG. 8, the substrate and the manufacturing method therefor in the second embodiment are completely the same as the substrate and the manufacturing method therefor in the first embodiment, that is, the substrate in the semiconductor structure and the manufacturing method therefor in the first embodiment are introduced into the second embodiment in entirety. The substrate 10 in the semiconductor structure in the first embodiment may be manufactured and marketed separately.

FIG. 9 is a cross-sectional schematic structural diagram of a semiconductor structure according to a third embodiment of the present disclosure. FIG. 10 is a flowchart of a method for manufacturing a semiconductor structure in FIG. 9.

With reference to FIG. 9 and FIG. 10, the semiconductor structure in the third embodiment and the semiconductor structure in the first embodiment are substantially the same and only differ in that: grooves 101 are provided on a back surface 10b of a substrate 10. Accordingly, the method for manufacturing the semiconductor structure in the third embodiment and the method for manufacturing the semiconductor structure in the first embodiment are substantially the same and only differ in that: in step S1', grooves 101 are provided on a back surface 10b of a premanufactured substrate 10'.

In some embodiments, in one of the at least one unit region 100, grooves 101 in part of the subunit regions 100a may further be provided on a front surface 10a of a premanufactured substrate 10', grooves 101 in another part of the subunit regions 100a are provided on a back surface 10b of the premanufactured substrate 10', and preset depths and preset widths of the grooves 101 of various subunit regions 100a and preset pore densities of various subunit regions 100a are the same such that preset porosities of the various subunit regions 100a are controlled to be the same.

No matter when the grooves 101 are provided on the back surface 10b of the premanufactured substrate 10' or when the grooves 101 are provided on the front surface 10a of the premanufactured substrate 10', in one of the at least one unit region 100, preset porosities of various subunit regions 100a are the same, and heat conduction materials 102 in the grooves 101 of different subunit regions 100a are different. Therefore, when a susceptor transfers heat to a substrate 10, heat conduction efficiencies of different heat conduction materials 102 are different. Under the influences of a growth temperature on a luminous property of the multi-quantum well material layer 20c, the light-emitting layer 20 grown on the front surface 10a of the substrate has different light-emitting wavelengths.

FIG. 11 is a cross-sectional schematic structural diagram of a substrate according to a fourth embodiment of the present disclosure. FIG. 12 is a flowchart of a method for manufacturing a substrate in FIG. 11.

With reference to FIG. 11 and FIG. 12, the substrate and the manufacturing method therefor in the fourth embodiment are completely the same as the substrate and the manufacturing method therefor in the semiconductor structure in the third embodiment, that is, the substrate in the semiconductor structure and the manufacturing method therefor in the third embodiment are introduced into the fourth embodiment in entirety. The substrate 10 in the semiconductor structure in the third embodiment may be manufactured and marketed separately.

Figure 13:
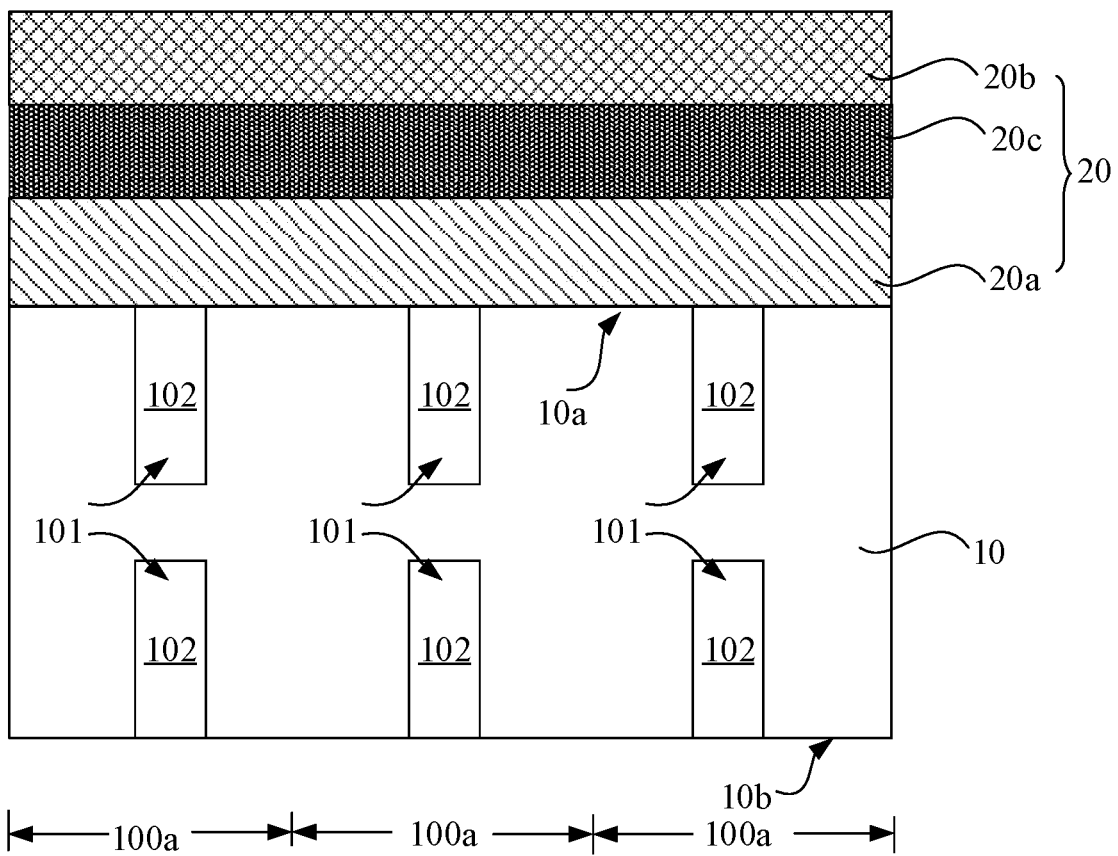
FIG. 13 is a cross-sectional schematic structural diagram of a semiconductor structure according to a fifth embodiment of the present disclosure.

FIG. 13 is a cross-sectional schematic structural diagram of a semiconductor structure according to a fifth embodiment of the present disclosure.

With reference to FIG. 13, the semiconductor structure in the fifth embodiment and the semiconductor structures in the first embodiment and the third embodiment are substantially the same and only differ in that: grooves 101 of each of the subunit regions 100a are provided on a front surface 10a and a back surface 10b of a substrate 10; and preset depth sums and preset widths of the grooves 101 of various subunit regions 100a and preset pore densities of various subunit regions 100a are the same, such that preset porosities of the various subunit regions 100a are controlled to be the same. Accordingly, the method for manufacturing the semiconductor structure in the fifth embodiment and the methods for manufacturing the semiconductor structure in the first embodiment and the third embodiment are substantially the same and only differ in that: in step S1, grooves 101 of each of the subunit regions 100a are provided on a front surface 10a and a back surface 10b of a premanufactured substrate 10'; and preset depth sums of two grooves 101 on the front surface 10a and the back surface 10b, preset widths of the grooves 101 of various subunit region 100a and preset pore densities of various subunit region 100a are the same, such that preset porosities of the various subunit regions 100a are controlled to be the same.

In one of the at least one unit region 100, porosities of the heat conduction materials 102 in the two grooves 101 of each of the subunit regions 100a are the same. Porosities of the heat conduction materials 102 in the grooves 101 of various subunit regions 100a are different. In some embodiments, porosities of the heat conduction materials 102 in the two grooves 101 of each of the subunit regions 100a may be different.

In one of the at least one unit region 100, heat conduction coefficients of the heat conduction materials 102 in the two grooves 101 of each of the subunit regions 100a are the same. Heat conduction coefficients of the heat conduction materials 102 in the grooves 101 of various subunit regions 100a are different. In some embodiments, heat conduction coefficients of the heat conduction materials 102 in the two grooves 101 of each of the subunit regions 100a may be different.

In some embodiments, in one of the at least one unit region 100, grooves 101 in part of the subunit regions 100a may further be provided on a front surface 10a or a back surface 10b of the substrate 10; and grooves 101 in another part of the subunit regions 100a are provided on a front surface 10a and a back surface 10b of the substrate 10. Preset depths of the grooves 101 on the front surface 10a or the back surface 10b of the substrate 10 are equal to preset depth sums of the grooves 101 provided on the front surface 10a and the back surface 10b of the substrate 10. In addition, preset widths of various grooves 101 and preset pore densities are the same, such that preset porosities of various subunit regions 100a are controlled to be the same.

Figure 14:
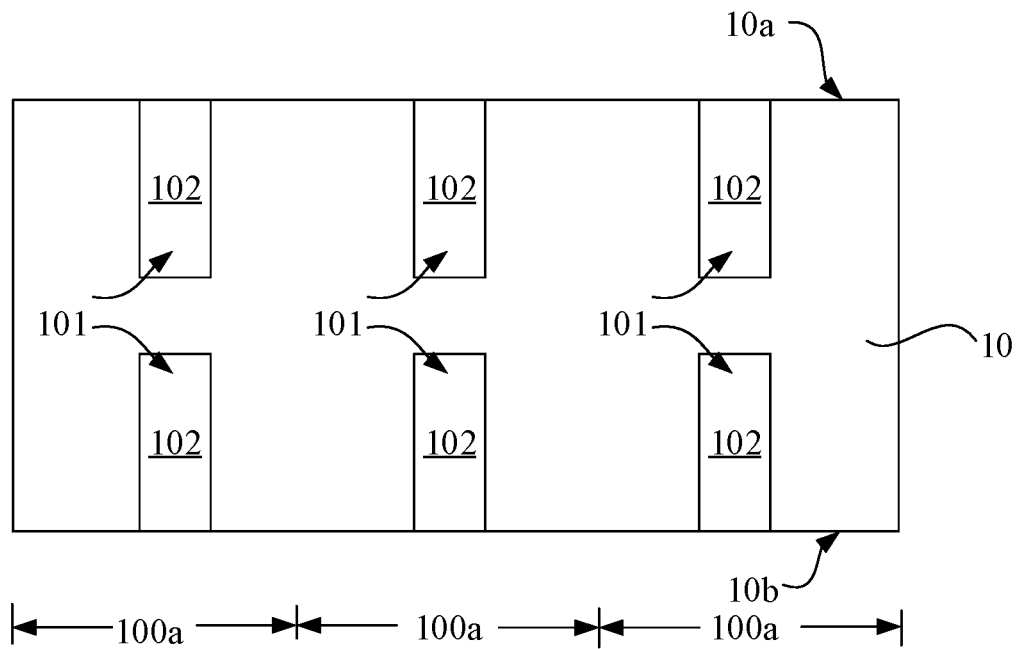
FIG. 14 is a cross-sectional schematic structural diagram of a substrate according to a sixth embodiment of the present disclosure.

FIG. 14 is a cross-sectional schematic structural diagram of a substrate according to a sixth embodiment of the present disclosure.

With reference to FIG. 14, the substrate and the manufacturing method therefor in the sixth embodiment are completely the same as the substrate in the semiconductor structure and the manufacturing method therefor in the fifth embodiment, that is, the substrate in the semiconductor structure and the manufacturing method therefor in the fifth embodiment are introduced into the sixth embodiment in entirety. The substrate 10 in the semiconductor structure in the fifth embodiment may be manufactured and marketed separately.

Figure 15:
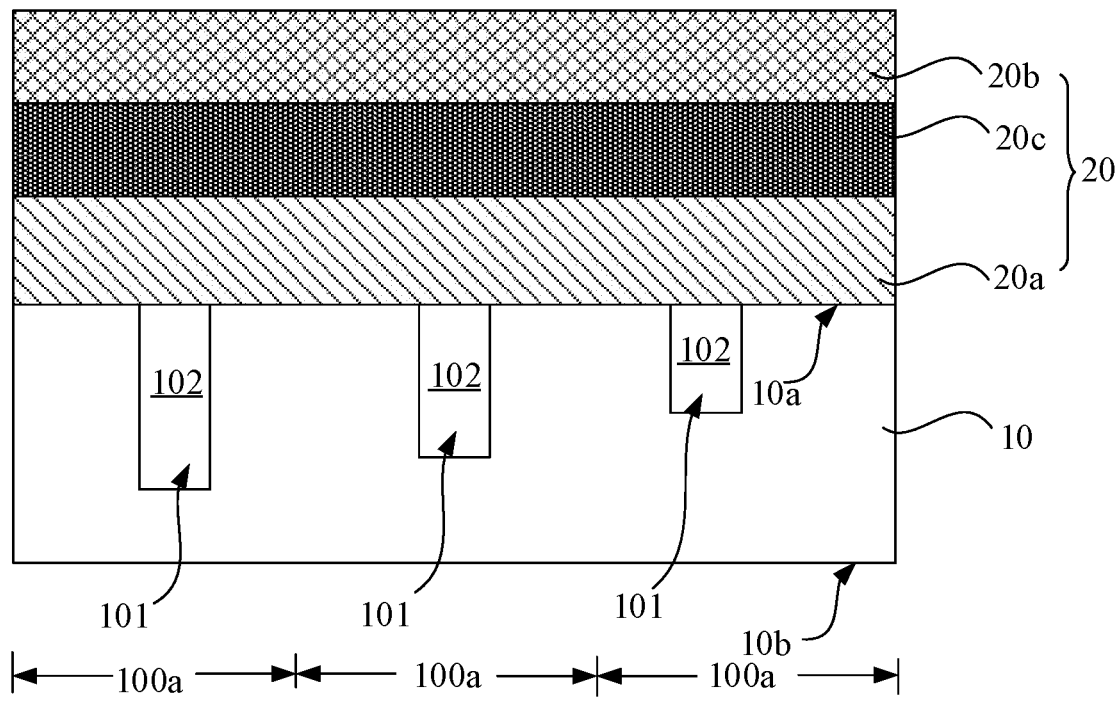
FIG. 15 is a cross-sectional schematic structural diagram of a semiconductor structure according to a seventh embodiment of the present disclosure.

FIG. 15 is a cross-sectional schematic structural diagram of a semiconductor structure according to a seventh embodiment of the present disclosure.

With reference to FIG. 15, the semiconductor structure in the seventh embodiment and the semiconductor structures in the first embodiment and the third embodiment are substantially the same and only differ in that: in one of the at least one unit region 100, preset depths of grooves 100 of various subunit regions 100a are different. Accordingly, the method for manufacturing the semiconductor structure in the seventh embodiment and the methods for manufacturing the semiconductor structure in the first embodiment and the third embodiment are substantially the same and only differ in that: in step S1, in one of the at least one unit region 100, grooves 101 that have the same preset width, the same preset pore density and different preset depths are provided in various subunit regions 100a on a front surface 10a of a premanufactured substrate 10'.

In one of the at least one unit region 100, preset depth differences between the grooves 101 of the subunit regions 100a may be fixed values and alternatively may be variable values.

In some embodiments, in one of the at least one unit region 100, preset widths of grooves 101 of various subunit regions or preset pore densities of various subunit regions 100a may be different, such that preset porosities of the various subunit regions 100a are adjusted to be different.

In some embodiments, in one of the at least one unit region 100, preset depths, and/or preset widths of grooves 101 of various subunit regions and/or preset pore densities of various subunit regions 100a are different, such that preset porosities of the various subunit regions 100a are adjusted to be different. For example, preset depths of the grooves 101 of two subunit regions 100a are different, and preset widths of the grooves 101 (or preset pore densities) of the two subunit regions 100a and a preset width of the groove 101 (or preset pore density) of another subunit region 100a is different from that of the two subunit regions 100a.

In some embodiments, the greater the preset porosity of one subunit region 100a is, the greater the porosity of the heat conduction material 102 in the groove 101 of the subunit region 100a may be, such that the heat conduction efficiency of the subunit region 100a is further reduced. The smaller the preset porosity of one subunit region 100a is, the smaller the porosity of the heat conduction material 102 in the groove 101 of the subunit region 100a may be, such that the heat conduction efficiency of the subunit region 100a is further improved.

In some embodiments, the greater the preset porosity of one subunit region 100a is, the smaller the porosity of the heat conduction material 102 in the groove 101 of the subunit region 100a may further be; and the smaller the preset porosity of one subunit region 100a is, the greater the porosity of the heat conduction material 102 in the groove 101 of the subunit region 100a is, such that heat conduction efficiencies of the subunit regions 100a with different preset porosities are fine adjusted.

In some embodiments, porosities of the heat conduction materials 102 in the grooves 101 of various subunit regions 100a are the same.

In some embodiments, components of the heat conduction materials 102 in the grooves 101 of the subunit regions 100a with different preset porosities are different. The greater the preset porosity of one subunit region 100a is, the smaller the heat conduction coefficient of the heat conduction material 102 in the groove 101 of the subunit region 100a is, such that the heat conduction efficiency of the subunit region 100a is further reduced. The smaller the preset porosity of one subunit region 100a is, the greater the heat conduction coefficient of the heat conduction material 102 in the groove 101 of the subunit region 100a is, such that the heat conduction efficiency of the subunit region 100a is further improved.

In some embodiments, the greater the preset porosity of one subunit region 100a is, the greater the heat conduction coefficient of the heat conduction material 102 in the groove 101 of the subunit region 100a is. The smaller the preset porosity of one subunit region 100a is, the smaller the heat conduction coefficient of the heat conduction material 102 in the groove 101 of the subunit region 100a is, such that heat conduction efficiencies of the subunit regions 100a with different preset porosities are fine adjusted.

In some embodiments, components or heat conduction coefficients of the heat conduction materials 102 in the grooves 101 of the subunit regions 100a with different preset porosities are the same.

In some embodiments, grooves 101 may further be provided on a back surface 10b of a premanufactured substrate 10'.

In some embodiments, in one of the at least one unit region 100, grooves 101 of in part of the subunit regions 100a may further be provided on a front surface 10a of a premanufactured substrate 10', grooves 101 in another part of the subunit regions 100a are provided on a back surface 10b of the premanufactured substrate 10', and preset depths, and/or preset widths of the grooves 101 of various subunit regions 100a and/or preset pore densities of various subunit regions 100a are different, such that preset porosities of the various subunit regions 100a are controlled to be different.

The solution of the embodiment may be combined with the solutions in the first embodiment, the third embodiment and the fifth embodiment. That is, in one of the at least one unit region 100, preset depths or preset depth sums, preset widths of grooves 101 of various subunit regions and preset pore densities of part of the subunit regions 100a are the same, such that preset porosities of various subunit regions 100a are controlled to be the same, and porosities or heat conduction coefficients of heat conduction materials 102 therein are different. Preset depths, and/or preset widths of the grooves 101 in part of the subunit regions 100a and/or preset pore densities of another part of the subunit regions 100a are different, such that preset porosities of various subunit regions 100a are controlled to be different.

Figure 16:
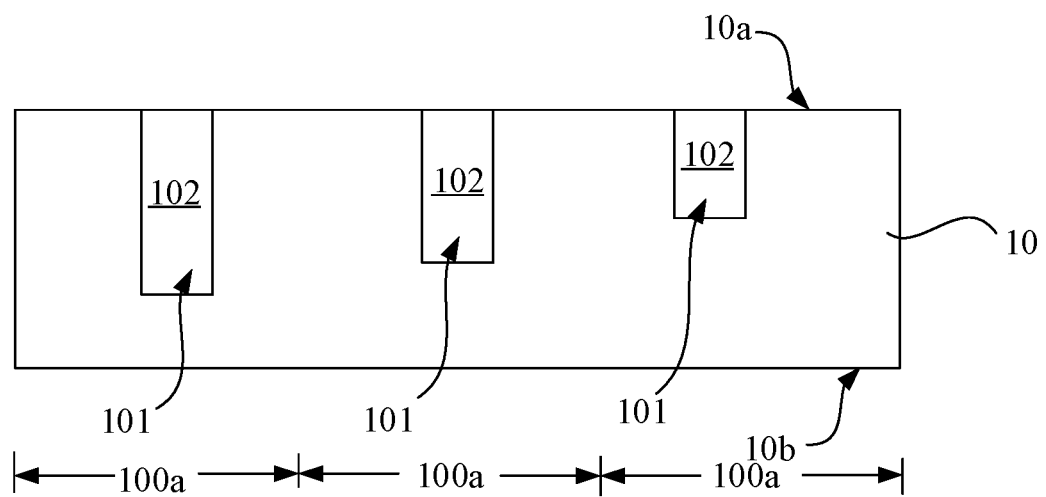
FIG. 16 is a cross-sectional schematic structural diagram of a substrate according to an eighth embodiment of the present disclosure.

FIG. 16 is a cross-sectional schematic structural diagram of a substrate according to an eighth embodiment of the present disclosure.

With reference to FIG. 16, the substrate and the manufacturing method therefor in the eighth embodiment are completely the same as the substrate in the semiconductor structure and the manufacturing method therefor in the seventh embodiment, that is, the substrate in the semiconductor structure and the manufacturing method therefor in the seventh embodiment are introduced into the eighth embodiment in entirety. The substrate 10 in the semiconductor structure in the seventh embodiment may be manufactured and marketed separately.

Figure 17:
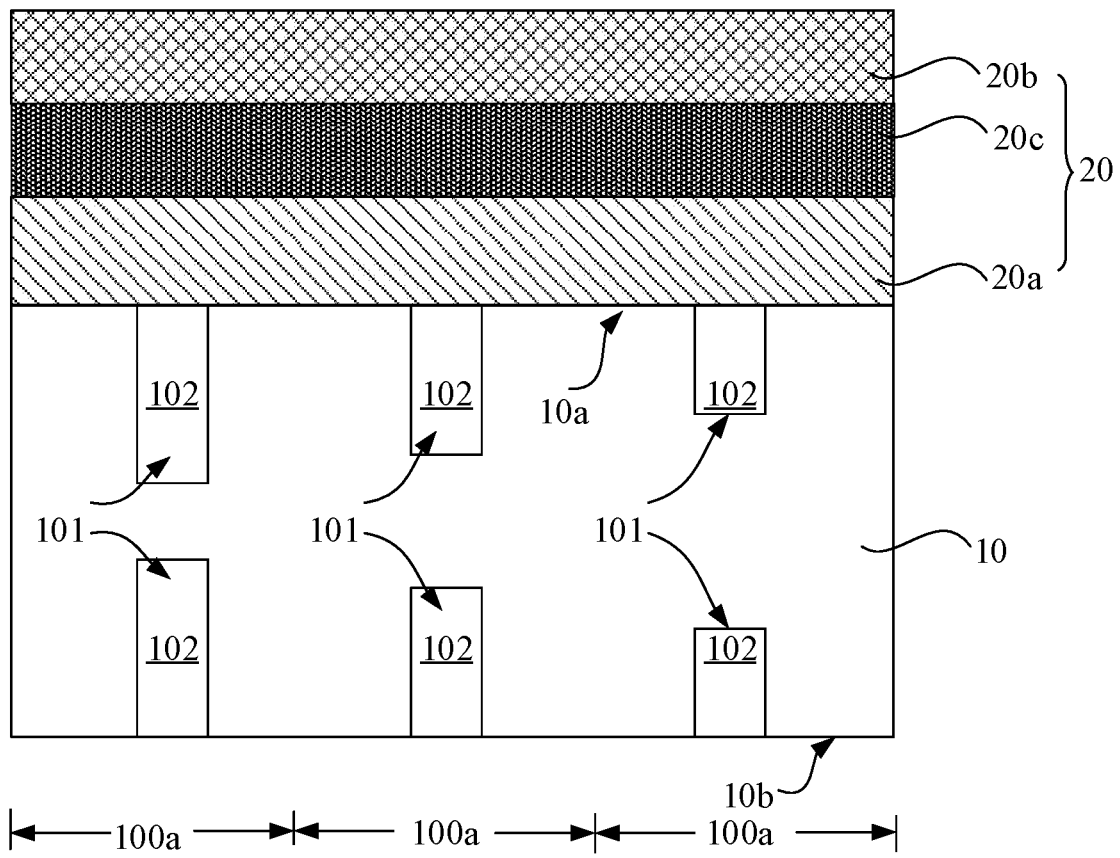
FIG. 17 is a cross-sectional schematic structural diagram of a semiconductor structure according to a ninth embodiment of the present disclosure.

FIG. 17 is a cross-sectional schematic structural diagram of a semiconductor structure according to a ninth embodiment of the present disclosure.

With reference to FIG. 17, the semiconductor structure in the ninth embodiment and the semiconductor structure in the eighth embodiment are substantially the same and only differ in that: grooves 101 of each of the subunit regions 100a are provided on a front surface 10a and a back surface 10b of a substrate 10; and preset widths of two grooves 101 on the front surface 10a and the back surface 10b of various subunit regions 100a and preset pore densities of various subunit regions 100a are the same, but preset depth sums of grooves 101 are provided in each of the subunit regions 100a on a front surface 10a and a back surface 10b of a substrate 10 are different, such that preset porosities of the various subunit regions 100a are controlled to be different. Accordingly, the method for manufacturing the semiconductor structure in the ninth embodiment and the method for manufacturing the semiconductor structure in the eighth embodiment are substantially the same and only differ in that: in step S1, grooves 101 of each of the subunit regions 100a are provided on a front surface 10a and a back surface 10b of a premanufactured substrate 10'; and preset widths of the two grooves 101 on the front surface 10a and the back surface 10b of various subunit regions 100a and preset pore densities of various subunit regions 100a are the same, but preset depth sums of the two grooves 101 of the various subunit regions 100a are different, such that preset porosities of the various subunit regions 100a are controlled to be different.

In some embodiments, in one of the at least one unit region 100, preset widths of grooves 101 of various subunit regions 100a or preset pore densities of various subunit regions 100a may be different, such that preset porosities of the various subunit regions 100a are adjusted to be different.

In some embodiments, in one of the at least one unit region 100, preset depths and/or preset widths of grooves 101 of various subunit regions 100a and/or preset pore densities of various subunit regions 100a are different such that preset porosities of the various subunit regions 100a are adjusted to be different. For example, preset depths of the grooves 101 of two subunit regions 100a are different, and preset widths of the grooves 101 (or preset pore densities) of the two subunit regions 100a and a preset width of the groove 101 (or preset pore densities) of another subunit region 100a is different from that of the two subunit regions 100a.

In one of the at least one unit region 100, porosities of the heat conduction materials 102 in the two grooves 101 of each of the subunit regions 100a are the same. Porosities of the heat conduction materials 102 in the grooves 101 of various subunit regions 100a are different. The greater the porosity of one subunit region 100a is (the greater the preset depth sum of the two grooves 101 is), the greater the porosity of the heat conduction material 102 in the groove 101 is. The smaller the porosity of one subunit region 100a is (the smaller the preset depth sum of the two grooves 101 is), the smaller the porosity of the heat conduction material 102 in the groove 101 is.

In some embodiments, porosities of the heat conduction materials 102 in the grooves 101 of various subunit regions 100a may further be the same.

In some embodiments, porosities of the heat conduction materials 102 in the two grooves 101 of each of the subunit regions 100a may be different.

In one of the at least one unit region 100, heat conduction coefficients of the heat conduction materials 102 in the two grooves 101 of each of the subunit regions 100a are the same. Heat conduction coefficients of the heat conduction materials 102 in the grooves 101 of various subunit regions 100a are different. The greater the porosity of one subunit region 100a is (the greater the preset depth sum of two grooves 101 is), the smaller the heat conduction coefficient of the heat conduction material 102 in the groove 101 is. The smaller the porosity of one subunit region 100a is (the smaller the preset depth sum of two grooves 101 is), the greater the heat conduction coefficient of the heat conduction material 102 in the groove 101 is.

In some embodiments, heat conduction coefficients of the heat conduction materials 102 in the grooves 101 of various subunit regions 100a may further be the same.

In some embodiments, heat conduction coefficients of the heat conduction materials 102 in the two grooves 101 of each of the subunit regions 100a may be different.

In some embodiments, in one of the at least one unit region 100, the grooves 101 in part of the subunit regions 100a may further be provided on a front surface 10a or a back surface 10b of the substrate 10; and the grooves 101 in another part of the subunit regions 100a are provided on a front surface 10a and a back surface 10b of the substrate 10. A preset depth of the groove 101 on the front surface 10a or the back surface 10b of the substrate 10 is not equal to preset depth sum of the grooves 101 provided on the front surface 10a and the back surface 10b of the substrate 10. Alternatively, preset widths of the grooves and preset pore densities of various subunit regions 100a are different, such that preset porosities of various subunit regions 100a are controlled to be different.

The solution of the embodiment may be combined with the solutions in the first embodiment, the third embodiment and the fifth embodiment. That is, in one of the at least one unit region 100, preset depths or preset depth sums, preset widths of grooves 101 in part of the subunit regions 100a and preset pore densities of another part of the subunit regions 100a are the same, such that preset porosities of various subunit regions 100a are controlled to be the same, and porosities or heat conduction coefficients of heat conduction materials 102 therein are different. Preset depth sums, and/or preset widths of the grooves in part of the subunit regions 100a and/or preset pore densities of another part of the subunit regions 100a are different, such that preset porosities of various subunit regions 100a are controlled to be different.

Figure 18:
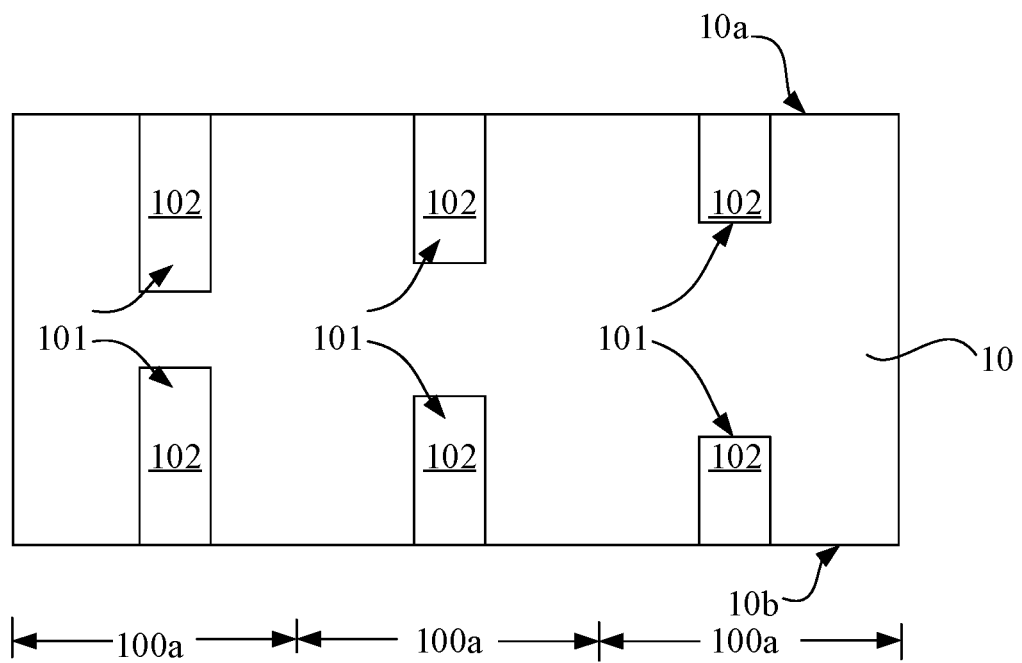
FIG. 18 is a cross-sectional schematic structural diagram of a substrate according to a tenth embodiment of the present disclosure.

FIG. 18 is a cross-sectional schematic structural diagram of a substrate according to a tenth embodiment of the present disclosure.

With reference to FIG. 18, the substrate and the manufacturing method therefor in the tenth embodiment are completely the same as the substrate in the semiconductor structure and the manufacturing method therefor in the ninth embodiment. That is, the substrate in the semiconductor structure and the manufacturing method therefor in the ninth embodiment are introduced into the tenth embodiment in entirety. The substrate 10 in the semiconductor structure in the ninth embodiment may be manufactured and marketed separately.

Figure 19:
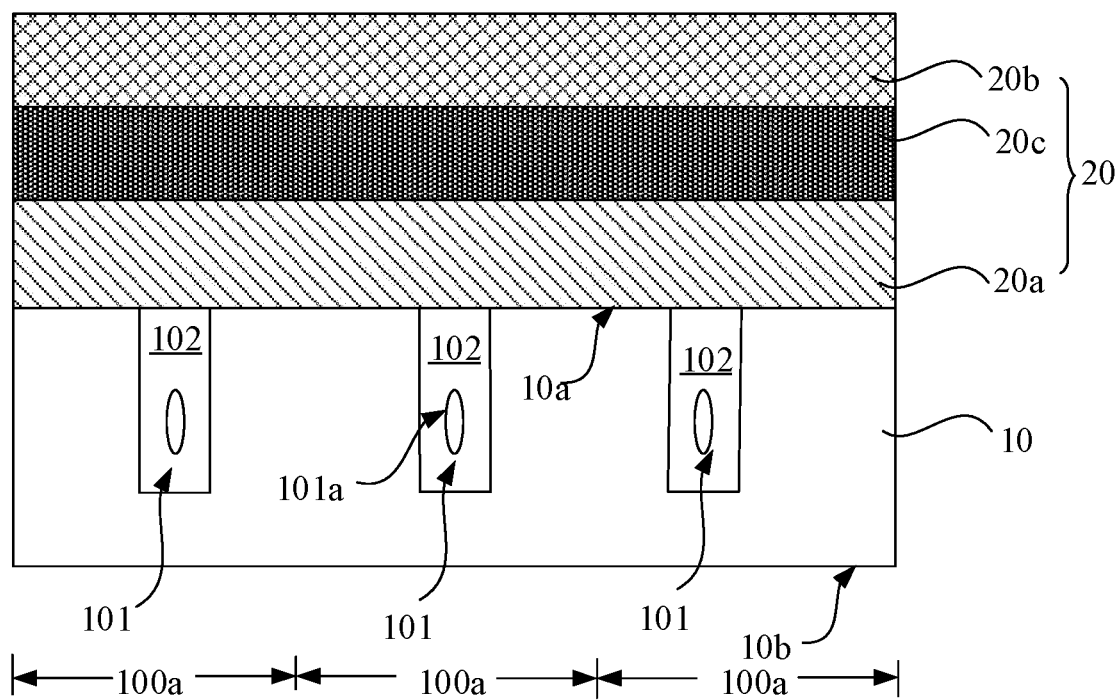
FIG. 19 is a cross-sectional schematic structural diagram of a semiconductor structure according to an eleventh embodiment of the present disclosure.

FIG. 19 is a cross-sectional schematic structural diagram of a semiconductor structure according to a eleventh embodiment of the present disclosure.

With reference to FIG. 19, the semiconductor structure in the eleventh embodiment and the semiconductor structures in the first embodiment, the third embodiment, the fifth embodiment, the seventh embodiment and the ninth embodiment are substantially the same and only differ in that: an air gap 101a is provided in a groove 101. Accordingly, the method for manufacturing the semiconductor structure in the eleventh embodiment and the methods for manufacturing the semiconductor structure in the first embodiment, the third embodiment, the fifth embodiment, the seventh embodiment and the ninth embodiment are substantially the same and only differ in that: in step S1, when the groove 101 is filled with a heat conduction material 102, the air gap 101a is provided in the groove 101.

In the eleventh embodiment, through the combination of a size of the air gap 101a and an amount of the heat conduction material 102, a heat conduction efficiency is adjusted.

The air gap 101a may be acquired by reducing a bias voltage between a plasma source and a susceptor in a deposition process or not applying a bias voltage and/or reducing a pumping rate of a cavity.

Figure 20:
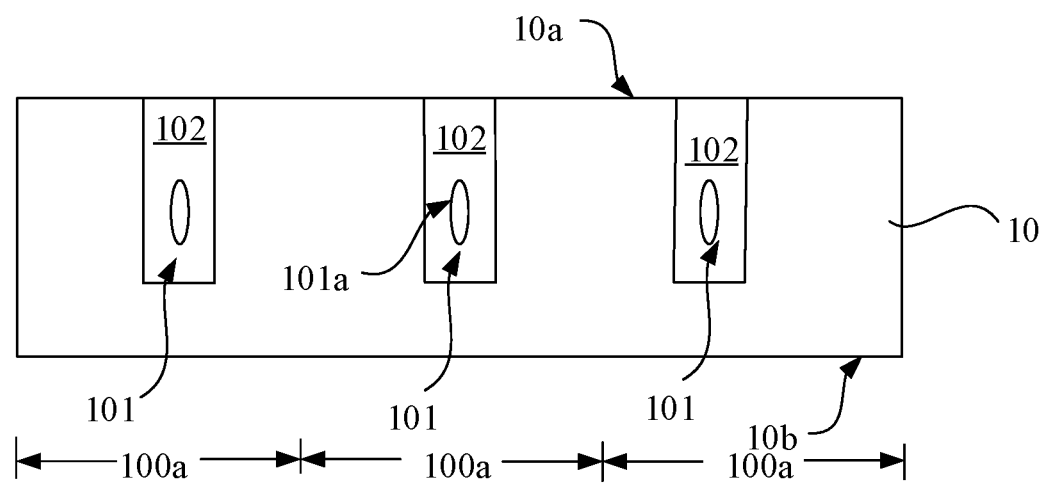
FIG. 20 is a cross-sectional schematic structural diagram of a substrate according to a twelfth embodiment of the present disclosure.

FIG. 20 is a cross-sectional schematic structural diagram of a substrate according to a twelfth embodiment of the present disclosure.

With reference to FIG. 20, the substrate and the manufacturing method therefor in the twelfth embodiment are completely the same as the substrate in the semiconductor structure and the manufacturing method therefor in the eleventh embodiment. That is, the substrate in the semiconductor structure and the manufacturing method therefor in the eleventh embodiment are introduced into the twelfth embodiment in entirety. The substrate 10 in the semiconductor structure in the eleventh embodiment may be manufactured and marketed separately.

Figure 21:
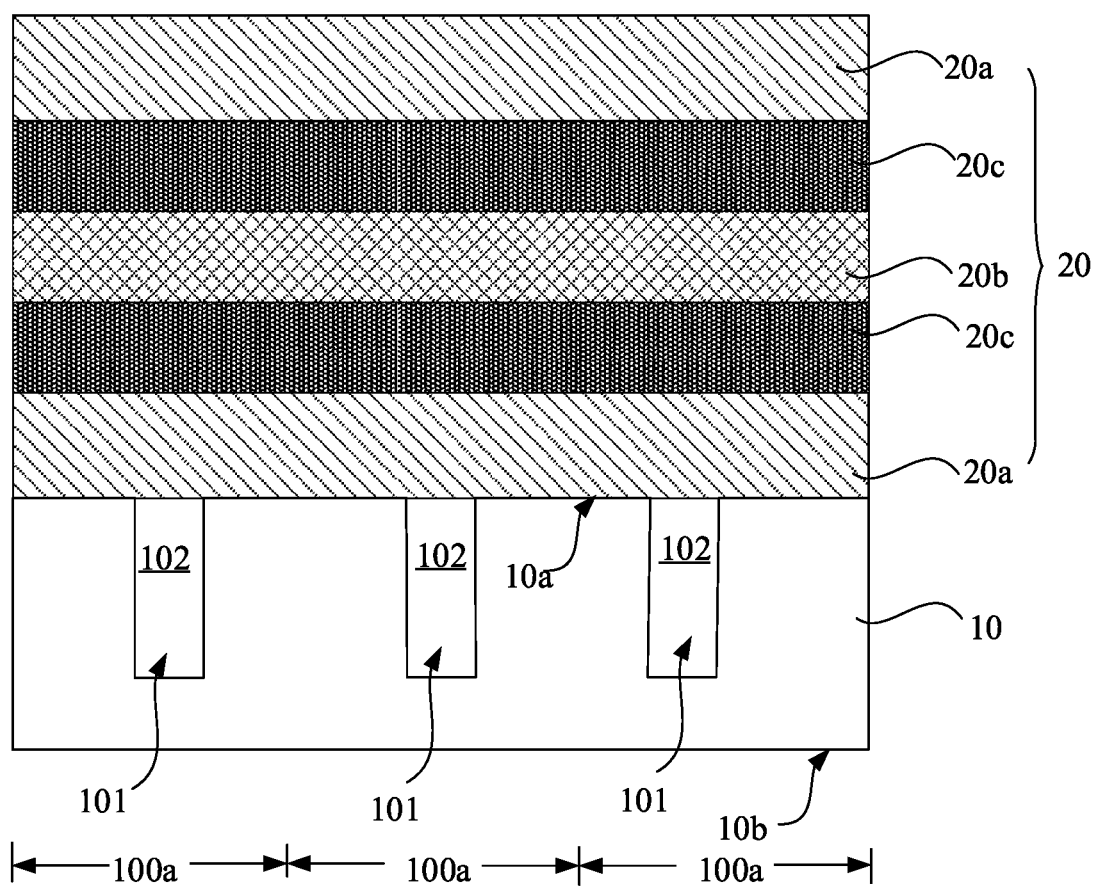
FIG. 21 is a cross-sectional schematic structural diagram of a semiconductor structure according to a thirteenth embodiment of the present disclosure.

FIG. 21 is a cross-sectional schematic structural diagram of a semiconductor structure according to a thirteenth embodiment of the present disclosure.

With reference to FIG. 21, the semiconductor structure in the thirteenth embodiment and the semiconductor structures in the first embodiment, the third embodiment, the fifth embodiment, the seventh embodiment, the ninth embodiment and the eleventh embodiment are substantially the same and only differ in that: the light-emitting layer 20 includes multiple N-type semiconductor layers 20a and multiple P-type semiconductor layers 20b, where the multiple N-type semiconductor layers 20a and the multiple P-type semiconductor layers 20b are disposed alternately, and multi-quantum well material layers 20c are respectively disposed between each of the N-type semiconductor layers 20a and the P-type semiconductor layers 20b adjacent to the N-type semiconductor layers 20a. Accordingly, the method for manufacturing the semiconductor structure in the thirteenth embodiment and the methods for manufacturing the semiconductor structure in the first embodiment, the third embodiment, the fifth embodiment, the seventh embodiment, the ninth embodiment and the eleventh embodiment are substantially the same and only differ in that: in step S2, the grown light-emitting layer 20 includes multiple N-type semiconductor layers 20a and multiple P-type semiconductor layers 20b, where the multiple N-type semiconductor layers 20a and the multiple P-type semiconductor layers 20b are disposed alternately, and multi-quantum well material layers 20c are respectively disposed between each of the N-type semiconductor layers 20a and the P-type semiconductor layers 20b adjacent to the N-type semiconductor layers 20a.

Comparing with the semiconductor structures in the first embodiment, the third embodiment, the fifth embodiment, the seventh embodiment, the ninth embodiment and the eleventh embodiment, the semiconductor structure in the thirteenth embodiment can improve light-emitting efficiency of the light-emitting layer 20.

In the present disclosure, the term "at least one" means one, two or more than two, unless otherwise specified.

The foregoing discloses the present disclosure, but does not limit the present disclosure. Any person skilled in the art can make various variations and modifications without departing from the spirit and scope of the present disclosure. Therefore, the protection scope of the present disclosure should subject to the scope defined by the claims.

The invention claimed is:

1. A substrate, comprising:
   at least one unit region having at least two subunit regions with, at least one groove in each of the at least two subunit regions, and a heat conduction material filled in each of the at least one groove; and in a first unit region of the at least one unit region, the at least two subunit regions have different heat conduction coefficients;
   wherein in the first unit region:
   (a) the grooves are on at least one of a front surface or a back surface of the substrate; or
   (b) the grooves in part of the at least two subunit regions are on the front surface or the back surface of the substrate, and the grooves in another part of the at least two subunit regions are on the front surface and the back surface of the substrate;
   wherein in the first unit region, the at least two subunit regions respectively have a same preset porosity, or the preset porosities of the part of the at least two subunit regions are the same, wherein heat conduction materials in the grooves in the at least two subunit regions are different;

wherein in the first unit region, the grooves in the at least two subunit regions are respectively filled with the heat conduction materials with different porosities;

wherein the greater the preset porosity of the subunit region is, the greater the porosity of the heat conduction material in the at least one groove is; and the smaller the preset porosity of the subunit region is, the smaller the porosity of the heat conduction material in the at least one groove is.

2. The substrate according to claim 1, wherein the at least one groove is fully filled with the heat conduction material, or an air gap is provided in the at least one groove.

3. The substrate according to claim 1, wherein a material of the substrate is at least one of sapphire, silicon, silicon carbide or a GaN-based material.

4. A semiconductor structure, comprising:
the substrate according to claim 1; and
a light-emitting layer disposed on the front surface of the substrate, wherein in the first unit region, a light-emitting wavelength of the light-emitting layer for each of the at least two subunit regions differs.

5. The semiconductor structure according to claim 4, wherein the light-emitting layer comprises:
an N-type semiconductor layer,
a P-type semiconductor layer, and
a multi-quantum well material layer disposed between the N-type semiconductor layer and the P-type semiconductor layer.

6. The semiconductor structure according to claim 5, wherein a forbidden bandwidth of the multi-quantum well material layer increases along with the rise of a growth temperature; the greater the preset porosity of the subunit region is, the greater the porosity of the heat conduction material in the at least one groove is, and the longer the light-emitting wavelength of the corresponding light-emitting layer is; and the smaller the preset porosity of the subunit region is, the smaller the porosity of the heat conduction material in the at least one grooves is, and the shorter the light-emitting wavelength of the corresponding light-emitting layer is.

7. The semiconductor structure according to claim 5, wherein a forbidden bandwidth of the multi-quantum well material layer increases along with the rise of a growth temperature; the greater the preset porosity of the subunit region is, the smaller a heat conduction coefficient of heat conduction material in the at least one groove is, and the longer the light-emitting wavelength of the corresponding light-emitting layer is; and the smaller the preset porosity of the subunit region is, the greater the heat conduction coefficient of the heat conduction material in the at least one groove is, and the shorter the light-emitting wavelength of the corresponding light-emitting layer is.

8. The semiconductor structure according to claim 4, wherein the light-emitting layer comprises multiple N-type semiconductor layers and multiple P-type semiconductor layers, wherein the multiple N-type semiconductor layers and the multiple P-type semiconductor layers are disposed alternately, and multi-quantum well material layers are respectively disposed between each of the N-type semiconductor layers and the P-type semiconductor layer adjacent to the N-type semiconductor layer.

9. The semiconductor structure according to claim 4, wherein the semiconductor structure is used for display; and the light-emitting layer of each of the at least one unit region form a light-emitting unit.

10. A method for manufacturing a substrate, comprising:
providing a premanufactured substrate comprising at least one unit region, and each of the at least one unit region comprises at least two subunit regions;
providing at least one groove in each of the at least two subunit regions on a surface of the premanufactured substrate; and
filling each of the at least one groove with a heat conduction material to form the substrate, wherein in a first unit region of the at least one unit region, the at least two subunit regions respectively have different heat conduction coefficients;
wherein in the first unit region:
(a) the grooves are provided on at least one of a front surface or a back surface of the substrate; or
(b) the grooves in part of the at least two subunit regions are provided on the front surface or the back surface of the substrate, and the grooves in another part of the at least two subunit regions are provided on the front surface and the back surface of the substrate;
wherein in the first unit region, the at least two subunit regions respectively have a same preset porosity, or the preset porosities of part of the at least two subunit regions are the same, wherein the heat conduction materials in the grooves in the at least two subunit regions are different;
wherein in the first unit region, the grooves in the at least two subunit regions are respectively filled with the heat conduction materials with different porosities;
wherein the greater the preset porosity of the subunit region is, the greater the porosity of the heat conduction material in the at least one groove is; and the smaller the preset porosity of the subunit region is, the smaller the porosity of the heat conduction material in the at least one groove is.

11. A method for manufacturing a semiconductor structure, comprising:
manufacturing the substrate by the method according to claim 10; and
growing a light-emitting layer on the front surface of the substrate, wherein in the first unit region, a light-emitting wavelength of the light-emitting layer for each of the at least two subunit regions differs.

12. A substrate, comprising:
at least one unit region, wherein each of the at least one unit region comprises at least two subunit regions, at least one groove is provided in each of the at least two subunit regions, and a heat conduction material is filled in each of the at least one groove; and in one of the at least one unit region, the at least two subunit regions respectively have different heat conduction coefficients;
wherein in the one of the at least one unit region,
(a) the grooves are provided on at least one of a front surface or a back surface of the substrate; or
(b) in the one of the at least one unit region, the grooves in part of the at least two subunit regions are provided on the front surface or the back surface of the substrate, and the grooves in another part of the at least two subunit regions are provided on the front surface and the back surface of the substrate;

wherein in the one of the at least one unit region, the at least two subunit regions respectively have a same preset porosity, or the preset porosities of the part of the at least two subunit regions are the same, wherein heat conduction materials in the grooves in the at least two subunit regions are different;

wherein in the one of the at least one unit region, the grooves in the at least two subunit regions are respectively filled with the heat conduction materials with different heat conduction coefficients;

wherein the greater the preset porosity of the subunit region is, the smaller the heat conduction coefficient of the heat conduction material in the at least one groove is; and the smaller the preset porosity of the subunit region is, the greater the heat conduction coefficient of the heat conduction material in the at least one groove is.

* * * * *